(12) United States Patent
Goto et al.

(10) Patent No.: US 8,767,399 B2
(45) Date of Patent: Jul. 1, 2014

(54) COOLING SYSTEM FOR ELECTRONIC DEVICE

(75) Inventors: Akira Goto, Isehara (JP); Shigemasa Sato, Hadano (JP)

(73) Assignee: Hitachi, Ltd., Tokyo (JP)

( * ) Notice: Subject to any disclaimer, the term of this patent is extended or adjusted under 35 U.S.C. 154(b) by 192 days.

(21) Appl. No.: 13/528,543

(22) Filed: Jun. 20, 2012

(65) Prior Publication Data

US 2013/0083481 A1 Apr. 4, 2013

(30) Foreign Application Priority Data

Sep. 29, 2011 (JP) ................................. 2011-213662

(51) Int. Cl.
*H05K 7/20* (2006.01)
(52) U.S. Cl.
USPC ....... 361/695; 361/679.51; 361/691; 454/184
(58) Field of Classification Search
USPC ....................... 361/679.46–679.52, 688–697, 361/701–704, 707–710, 715–722, 755
See application file for complete search history.

(56) References Cited

U.S. PATENT DOCUMENTS

| | | | | |
|---|---|---|---|---|
| 6,587,340 | B2* | 7/2003 | Grouell et al. | 361/695 |
| 6,991,533 | B2* | 1/2006 | Tsai et al. | 454/184 |
| 7,286,345 | B2* | 10/2007 | Casebolt | 361/679.48 |
| 7,554,803 | B2* | 6/2009 | Artman et al. | 361/695 |
| 7,612,996 | B2* | 11/2009 | Atkins et al. | 361/679.51 |
| 7,894,191 | B2* | 2/2011 | Tsuchiya | 361/695 |
| 8,373,987 | B2* | 2/2013 | Kang et al. | 361/695 |
| 8,416,571 | B2* | 4/2013 | Mizumura et al. | 361/695 |
| 2004/0196631 | A1* | 10/2004 | Ueda et al. | 361/695 |
| 2004/0217072 | A1* | 11/2004 | Bash et al. | 211/26 |
| 2005/0168945 | A1* | 8/2005 | Coglitore | 361/695 |
| 2005/0241810 | A1* | 11/2005 | Malone et al. | 165/122 |
| 2009/0262499 | A1* | 10/2009 | Chou | 361/695 |

FOREIGN PATENT DOCUMENTS

| | | |
|---|---|---|
| JP | 2000-277956 | 10/2000 |
| JP | 2009-123887 | 6/2009 |
| JP | 2011-003571 | 1/2011 |

* cited by examiner

*Primary Examiner* — Courtney Smith
(74) *Attorney, Agent, or Firm* — Stephen J. Weyer, Esq.; Stites & Harbison, PLLC.

(57) ABSTRACT

The cooling system includes: a frame; a plurality of electronic devices disposed in the frame and operating or functioning independently from each other; fans disposed in the frame and supplying cooling air to the electronic devices; a temperature acquiring portion for acquiring the temperature of the cooling air; an air-flow resistance adjusting portion for adjusting the air-flow resistance to the cooling air; and a controller for controlling the fans and the each air-flow resistance adjusting portion. The controller determines each target cooling air volume required for cooling each electronic device to a predetermined temperature based on temperature information acquired by the temperature acquiring portion and heat generation information on each electronic device, controls each air-flow resistance adjusting portion to set the volume of cooling air to each target cooling air volume, and performs the drive control of the fans to set the volume of cooling air to the minimum necessary.

6 Claims, 11 Drawing Sheets

| CONTROL TABLE (CURRENT VALUES) |||| 
|---|---|---|---|
| OBJECT BLADE | INLET AIR TEMPERATURE [degC] | POWER CONSUMPTION [W] | AIR VOLUME [m³/min] |
| FIRST-STAGE BLADE | 34.8 | 1280 | 2.274 |
| SECOND-STAGE BLADE | 34.7 | 560 | 2.274 |
| THIRD-STAGE BLADE | 34.5 | 558 | 2.266 |
| FOURTH-STAGE BLADE | 34.8 | 561 | 2.278 |

| OBJECT FAN | FAN SPEED [rpm] |
|---|---|
| UPSTREAM FAN | 3500 |
| DOWNSTREAM FAN | 4200 |

FIG. 7

CONTROL TABLE (TARGET VALUES)

| POWER CONSUMPTION [W] | COOLING AIR DEMAND [m3/min] | | |
|---|---|---|---|
| | INLET AIR 35°C | INLET AIR 30°C | INLET AIR 25°C |
| 1300 | 2.266 | 1.950 | 1.712 |
| 1200 | 2.090 | 1.800 | 1.580 |
| 1100 | 1.916 | 1.650 | 1.449 |
| 1000 | 1.742 | 1.500 | 1.317 |
| 900 | 1.568 | 1.350 | 1.185 |
| 800 | 1.394 | 1.200 | 1.054 |
| 700 | 1.219 | 1.050 | 0.922 |
| 600 | 1.045 | 0.900 | 0.790 |
| 500 | 0.871 | 0.750 | 0.659 |
| 400 | 0.697 | 0.600 | 0.527 |
| 300 | 0.523 | 0.450 | 0.395 |
| 200 | 0.348 | 0.300 | 0.263 |
| 100 | 0.174 | 0.150 | 0.132 |

FIG. 8

AIR-FLOW RESISTANCE CONTROL TABLE

| AIR-FLOW RESISTANCE ADJUSTING MECHANISM ANGLE $\theta$ | AIR-FLOW RESISTANCE CHARACTERISTIC FORMULA | |
|---|---|---|
| | COEFFICIENT $\alpha$ | |
| 0 | 1.0 | |
| 5 | 1.2 | |
| 10 | 1.3 | |
| 15 | 1.5 | |
| 20 | 1.7 | |
| 25 | 1.8 | |
| 30 | 2.0 | |
| 35 | 2.3 | AIR-FLOW RESISTANCE [Pa]= $\alpha \times (24.937 \times (\text{AIR VOLUME [m3/min]})^2 -2\text{E}-12 \times (\text{AIR VOLUME [m3/min]}) + 7\text{E}-12)$ |
| 40 | 2.7 | |
| 45 | 3.0 | |
| 50 | 3.3 | |
| 55 | 3.7 | |
| 60 | 4.0 | |
| 65 | 4.7 | |
| 70 | 5.3 | |
| 75 | 6.0 | |
| 80 | 6.7 | |
| 85 | 7.3 | |
| 90 | 8.0 | |

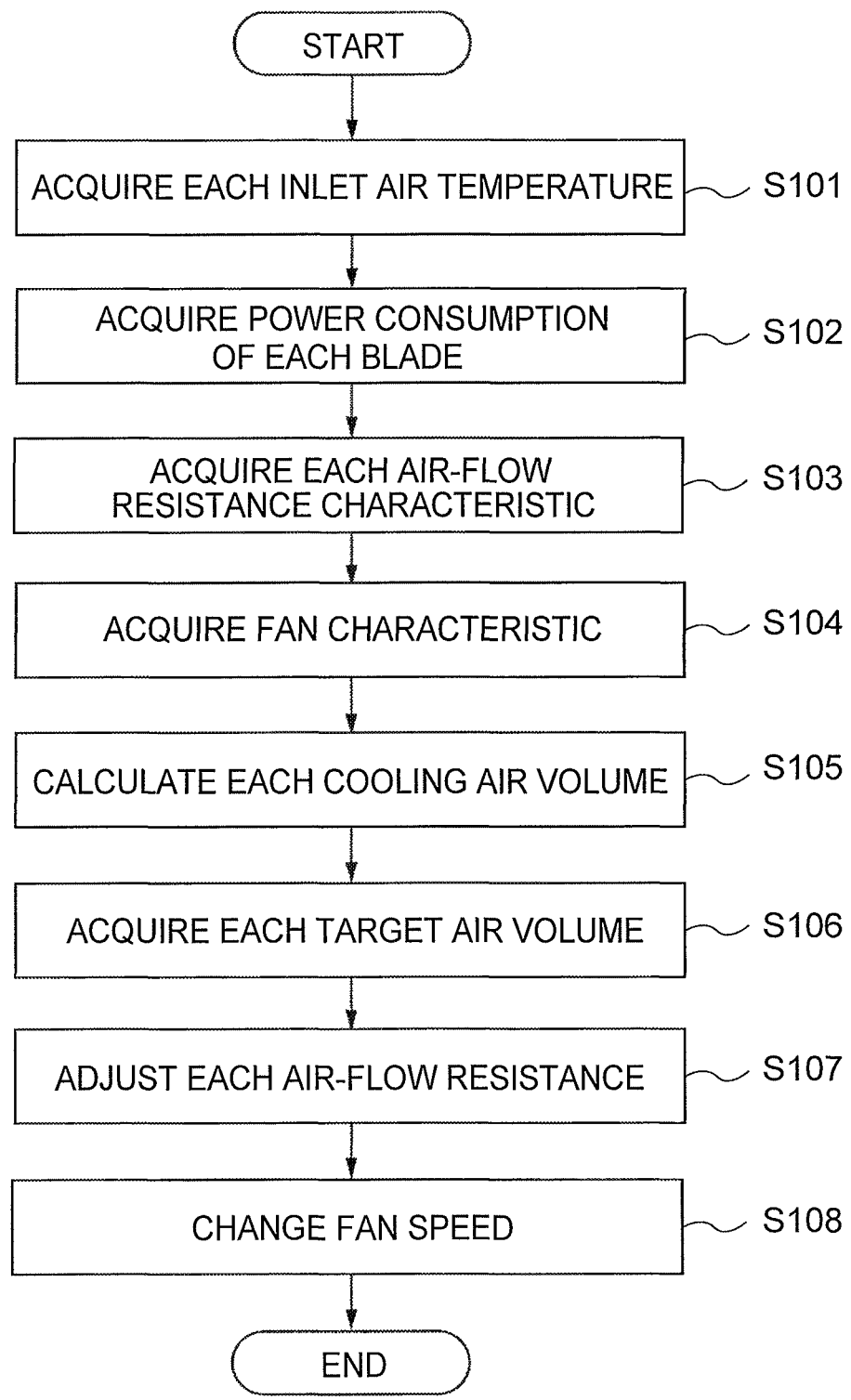

(12) United States Patent
US 8,767,399 B2

COOLING SYSTEM FOR ELECTRONIC DEVICE

CLAIM OF PRIORITY

The present application claims priority from Japanese application JP 2011-213662 filed on Sep. 29, 2011, the content of which is hereby incorporated by reference into this application.

BACKGROUND OF THE INVENTION

1. Field of the Invention

The present invention relates to a cooling system for use with an electronic device.

2. Related Arts

Semiconductors for use in electronic devices, particularly semiconductors represented by CPUs for information processors have achieved rapid progress. It is common knowledge that the semiconductors are subjected to ever-increasing packing density, and generating more heat. Accordingly, it has become a practice to mount a larger number of fans or to increase fan speed to provide adequate cooling of the electronic devices such as semiconductors. Hence, the noise level and power consumption of the electronic devices are on the increase. Since an increasing number of electronic devices are installed at offices and the like, there is a stronger demand for lowering the noise level of the electronic devices. Furthermore, a demand for power-saving feature is increasing from the standpoint of environmental load reduction.

The development of high efficiency cooling technology is required to meet such demands. Now, efforts are made to develop high efficiency fans and high performance heat sinks and to improve cooling structures (refer, for example, to JP-A Nos. 2000-277956, 2009-123887 and 2011-3571).

It is known that in a multifunction electronic device incorporating, in one frame, a plurality of electronic devices operating or functioning independently from each other and one or more fans arranged in series on an air flow passage for collectively cooling some or all of the electronic devices, a cooling air volume for each of the electronic devices disposed in the frame depends upon the air-flow resistance of the flow passage for each of the electronic devices and the capacity of the fan(s). According to the invention disclosed in JP-A No. 2000-277956, a required air volume for cooling is ensured by adjusting the capacity of the fan(s), e.g., increasing the revolving speed of the fan(s), because the air flow passage for the electronic devices exhibits a fixed air-flow resistance. Because of the structure of the multifunction electronic device in which some or all of the electronic devices in the frame are collectively cooled, an excessive volume of air is supplied to some of the electronic devices in order to supply a required volume of air to some other electronic devices. As a result, the fans consume excessive power and generate excessive noises.

According to the invention disclosed in JP-A No. 2009-123887, temperatures of inlet air into and exhaust air from each of the electronic devices are measured, and an amount of temperature rise is calculated from a difference between these air temperatures. The calculated amount of temperature rise is compared with a difference between a predetermined maximum inlet air temperature and a predetermined maximum exhaust air temperature. The volume of air required for cooling the electronic device is adjusted based on the comparison result. However, certain time takes before the variation in the power consumption of the electronic device and the variation in the air volume required for cooling (the variation in the air-flow resistance) are reflected on the temperature variation. Hence, it takes a long time to accomplish the optimization of the air volume required for cooling (optimization of air-flow resistance). Similarly, it takes a long time before the power consumption of the fan(s) is reduced. This makes it difficult for the system to achieve efficient power saving.

According to the invention disclosed in JP-A No. 2011-3571, a frame accommodating an electronic circuit board is formed with a plurality of windows, which are controllably opened or closed based on the temperature of electronic components mounted on the electronic circuit board thereby adjusting the volume of air for cooling the electronic circuit board according to the amount of heat generated by the electronic components thereon. This invention does not pay any consideration to the reduction of power consumption of the fans.

SUMMARY OF THE INVENTION

In view of the foregoing, the present invention seeks to provide a cooling system for an electronic device that is adapted for efficient power saving and can achieve noise reduction.

According to the present invention for achieving the above object, a cooling system for an electronic device includes: a frame; a plurality of electronic devices disposed in the frame and operating or functioning independently from each other; a fan disposed in the frame and supplying cooling air to the plurality of electronic devices for cooling the plurality of electronic devices; a temperature acquiring portion disposed in the frame and acquiring the temperature of the cooling air supplied to each of the electronic devices; an air-flow resistance adjusting portion disposed in the frame and adjusting the resistance to a flow of the cooling air supplied to the each electronic device; and a controller for controlling the fan and the each air-flow resistance adjusting portion, wherein the controller determines each target cooling air volume required for cooling the each electronic device to a predetermined temperature based on temperature information acquired by the temperature acquiring portion and heat generation information on the each electronic device, controls the each air-flow resistance adjusting portion to set the volume of cooling air supplied by the fan to the each target cooling air volume, and performs the drive control of the fan to set the volume of cooling air supplied by the fan to the minimum necessary.

By employing the cooling system according to the invention, power saving and noise reduction can be achieved without providing additional space outside the frame of the electronic device.

BRIEF DESCRIPTION OF THE DRAWINGS

FIG. 7 shows a control table (target values) of the cooling system according to the embodiment of the invention;

FIG. 8 shows a control table of an air-flow resistance adjusting portion of the cooling system according to the embodiment of the invention;

FIG. 13 is a flow chart showing the steps of an exemplary operation of the cooling system according to the embodiment of the invention.

DESCRIPTION OF THE PREFERRED EMBODIMENT

Next, a blade server employing a cooling system for electronic device according to an embodiment of the invention is described with reference to the accompanying drawings. It should be understood that the embodiment to be described hereinbelow is intended for illustration only and is not intended to limit the scope of the present disclosure. Therefore, the invention may be embodied in other specific forms without departing from the spirit and scope thereof. Thicknesses, sizes and proportions of parts of the drawings illustrating the embodiment are shown exaggerated or reduced for the sake of clarity and convenience.

Figure 1:
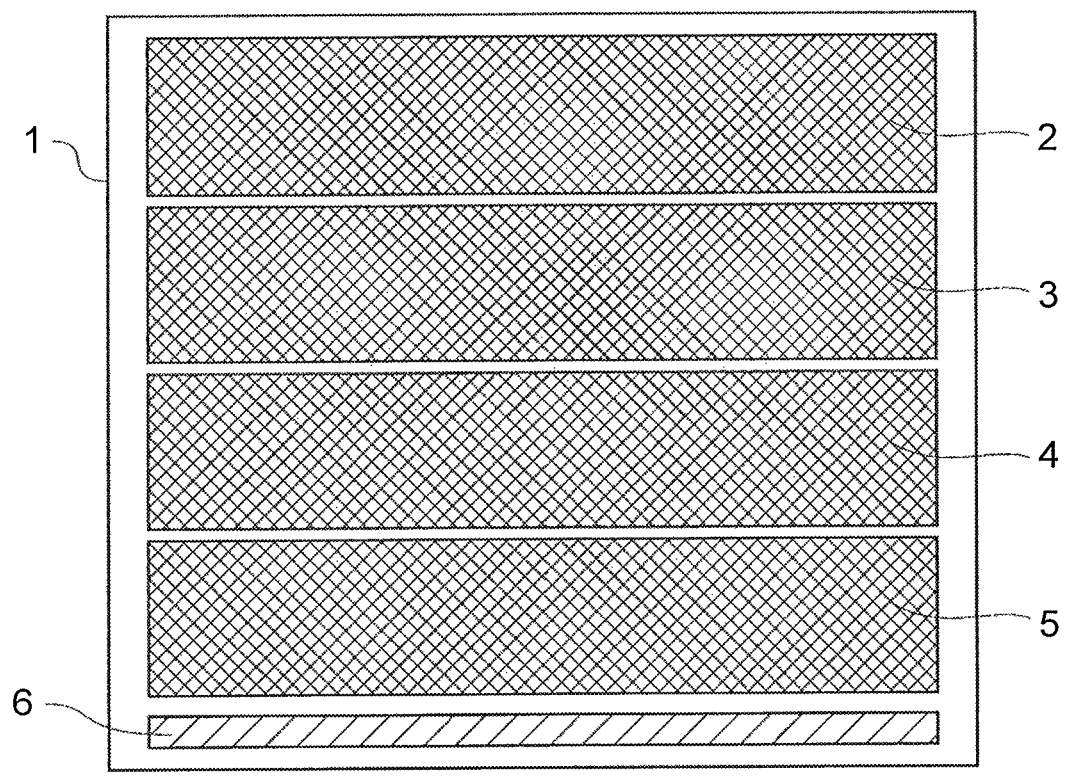
FIG. 1 is a front view showing a blade server employing a cooling system for electronic device according to an embodiment of the invention.
Figure 2:
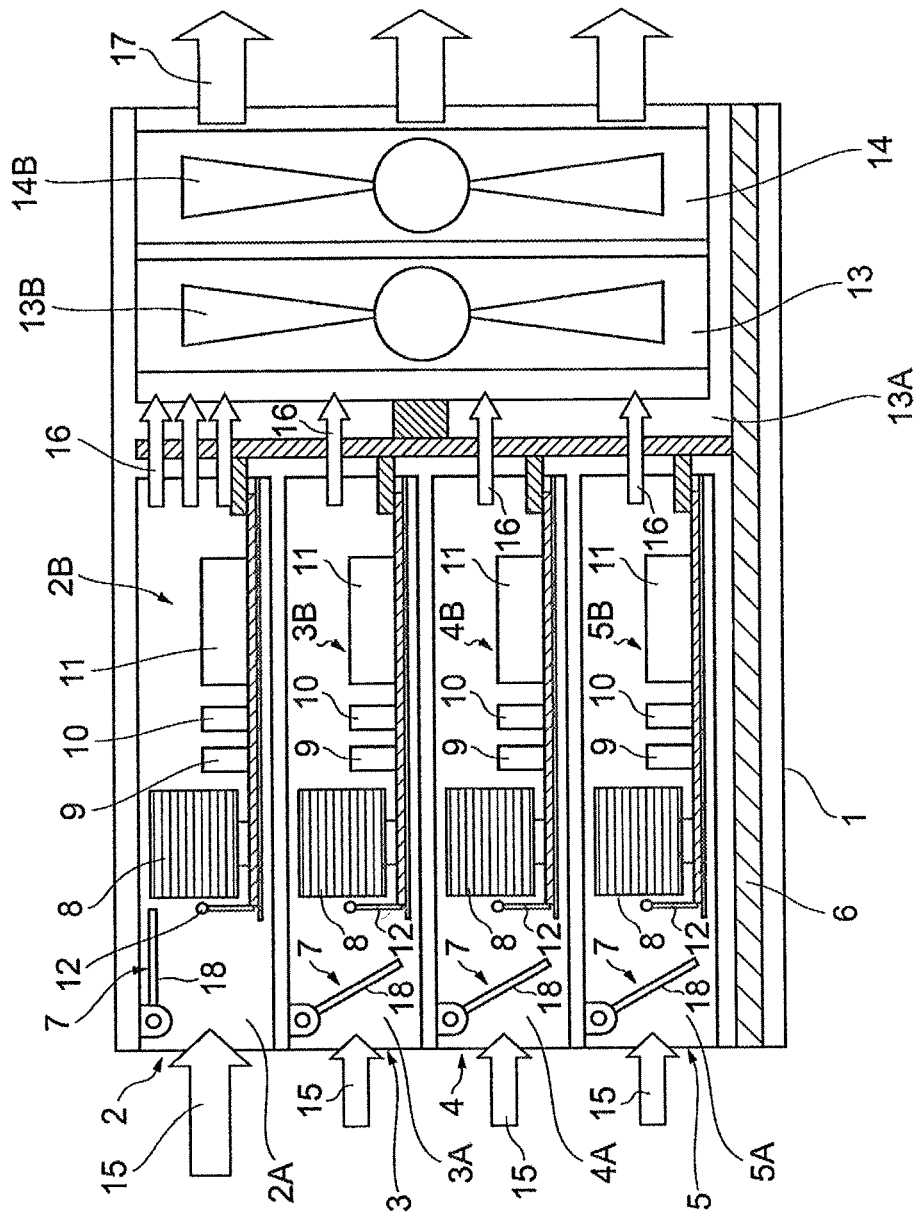
FIG. 2 is a side view showing an interior of the blade server shown in FIG. 1.
Figure 3:
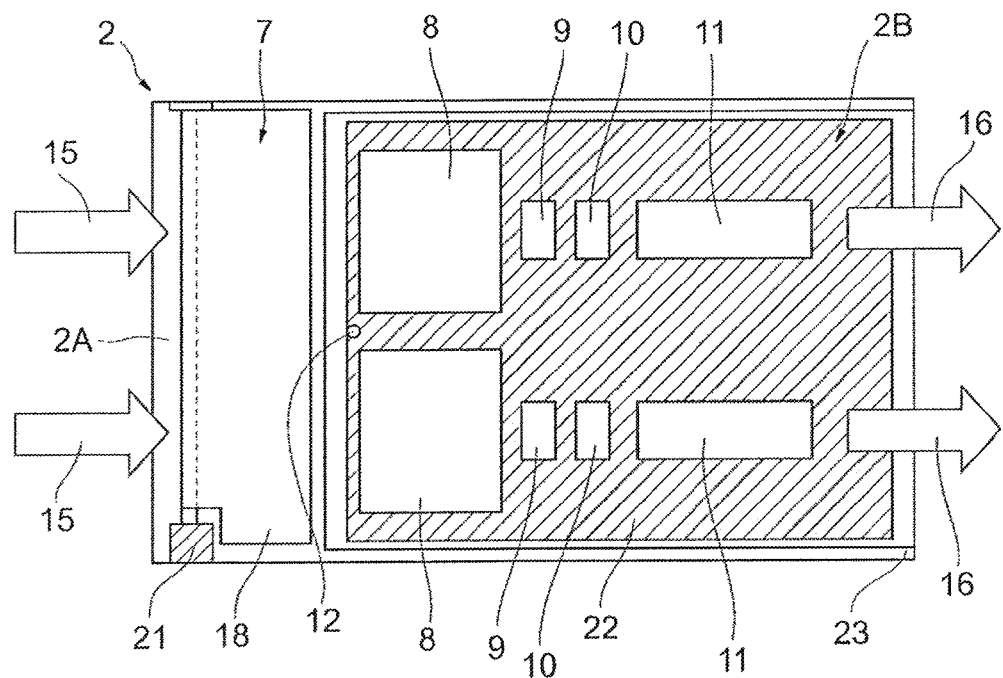
FIG. 3 is a plan view showing a part of the interior of the blade server shown in FIG. 1.
Figure 4:
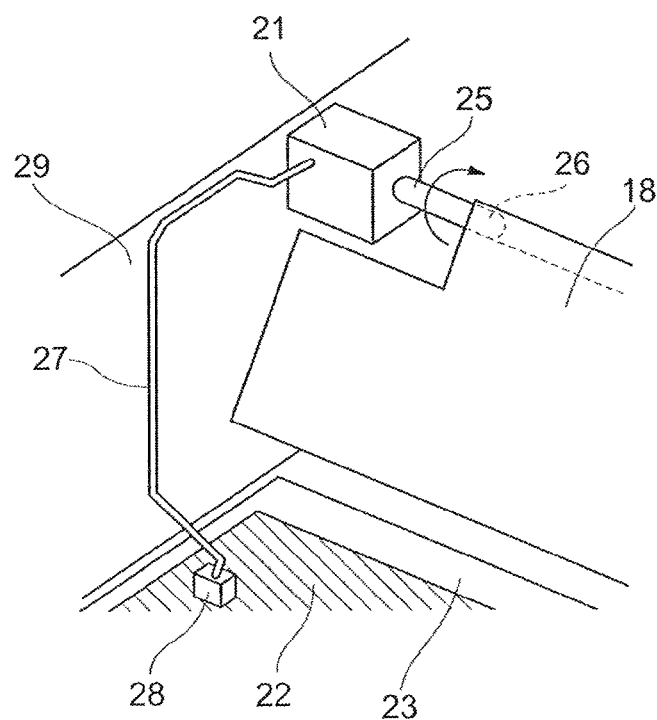
FIG. 4 is a perspective view showing a part of the interior of the blade server shown in FIG. 1.
Figures 5, 6:
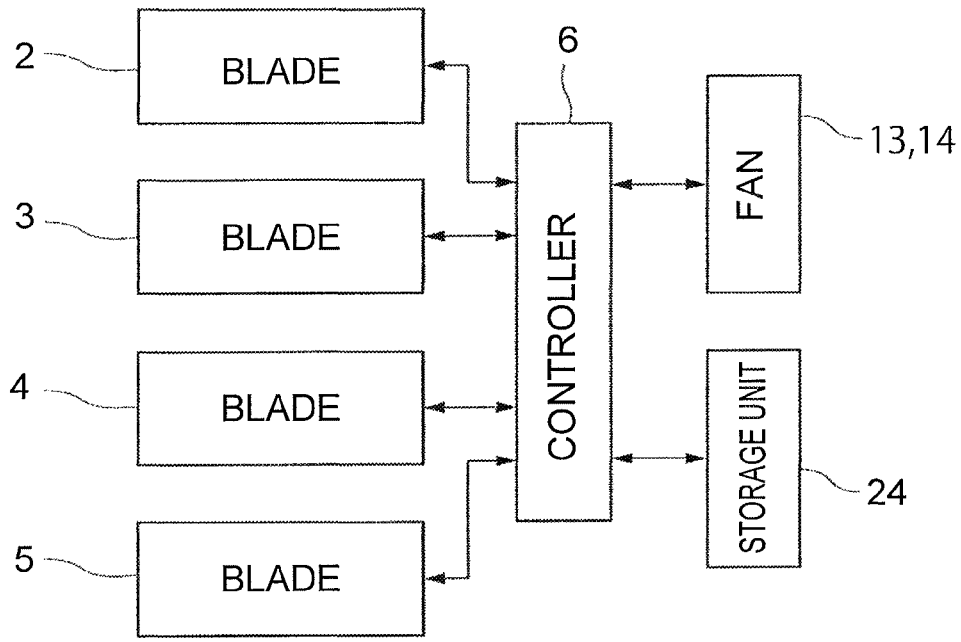
FIG. 5 is a control block diagram of the cooling system according to the embodiment of the invention.
FIG. 6 shows a control table (current values) of the cooling system according to the embodiment of the invention.
Figure 9:
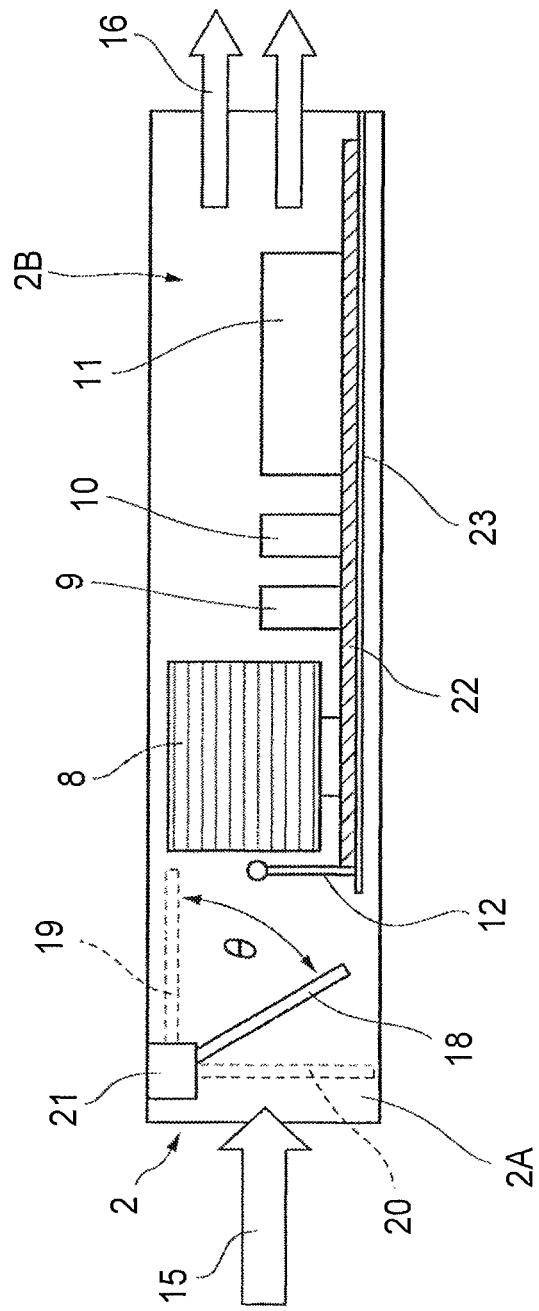
FIG. 9 is a sectional view of a single blade for illustrating the change in adjusting angle of an air-flow resistance adjuster plate of the air-flow resistance adjusting portion disposed in one of the blades of the blade server shown in FIG. 1.

FIG. 1 is a front view showing the blade server employing the cooling system for electronic device according to the embodiment of the invention. FIG. 2 is a side view showing an interior of the blade server shown in FIG. 1. FIG. 3 is a plan view showing a part of the interior of the blade server shown in FIG. 1. FIG. 4 is a perspective view showing a part of the interior of the blade server shown in FIG. 1. FIG. 5 is a control block diagram of the cooling system according to the embodiment of the invention. FIG. 6 shows a control table (current values) of the cooling system according to the embodiment of the invention. FIG. 7 shows a control table (target values) of the cooling system according to the embodiment of the invention. FIG. 8 shows a control table of an air-flow resistance adjusting portion of the cooling system according to the embodiment of the invention. FIG. 9 is a sectional view of a single blade for illustrating the change in adjusting angle of an air-flow resistance adjustor plate of the air-flow resistance adjusting portion disposed in a single blade of the blade server shown in FIG. 1.

As shown in FIG. 1 to FIG. 3, the blade server according to the embodiment includes: a frame 1; four blades 2 to 5 arranged in the frame 1 on one side thereof (the left-hand side as seen in FIG. 2) and operating or functioning independently from each other; an upstream fan 13 and a downstream fan 14 disposed in the frame 1 on the other side thereof (the right-hand side as seen in FIG. 2) and operative to supply cooling air to the blades 2 to 5; a controller 6 disposed in the frame 1 at a bottom thereof and operative to perform drive control of the blades 2 to 5, the upstream fan 13 and the downstream fan 14; a storage unit 24 for storing a variety of information items.

The frame 1 is divided into sub-portions arranged one above another. The frame includes blade accommodating portions 2A to 5A for accommodating the blades 2 to 5 therein, respectively, and a fan accommodating portion 13A adjoining the blade accommodating portions 2A to 5A and accommodating the upstream fan 13 and the downstream fan 14 therein.

The blade accommodating portions 2A to 5A are each formed with an opening on one side (the left-hand side as seen in FIG. 2) and the other side thereof (the right-hand side as seen in FIG. 2), respectively. Cooling air 15, supplied by the upstream fan 13 and the downstream fan 14, is allowed to enter through the respective openings on the one side of the blade accommodating portions 2A to 5A, flowing through the blade accommodating portions 2A to 5A to be discharged as exhaust air 16 from the respective openings on the other side thereof. Namely, an "upstream side" of the blade accommodating portions 2A to 5A is defined by the side from which the cooling air 15 enters the blade accommodating portions while a "downstream side" thereof is defined by the side from which the exhaust air is discharged. The openings formed on the other side are communicated with the fan accommodating portion 13A so that the exhaust air 16 from these openings is supplied to the fan accommodating portion 13A.

The fan accommodating portion 13A is disposed downstream of the blade accommodating portions 2A to 5A. Formed on the downstream side of the fan accommodating portion 13A are openings from which the exhaust air 16 entering the fan accommodating portion 13A is discharged. The exhaust air 16 flows through the fan accommodating portion 13A to be discharged by the upstream fan 13 and the downstream fan 14 as exhaust air 17 from the openings.

The blades 2 to 5 are provided with electronic devices 2B to 5B, respectively. Disposed upstream of the electronic devices 2B to 5B are air-flow resistance adjusting portions 7 for adjusting resistance to the flow of cooling air (cooling air volume) supplied to the electronic devices 2B to 5B, respectively.

The electronic devices 2B to 5B each include a heat radiating component 8, a heat generating components 9 to 11 and an inlet air temperature sensor 12 disposed upstream of the heat radiating component 8 for measuring an inlet temperature of the cooling air. These electronic devices 2B to 5B are connected to the controller 6 which will be described in detail hereinafter. A variety of information items such as power consumption of the individual electronic devices and the temperatures measured by the inlet air temperature sensors 12 are sent to the controller 6.

The individual blades 2 to 5 vary in the amount of heat generation according to the operating state such as calculation performance, although these blades have the same internal components configured the same way. Therefore, in an initial state (prior to control) where the air-flow resistance adjusting portions 7 do not perform the air-flow resistance adjustment, the individual blades 2 to 5 have the same air-flow resistance characteristic. Hereinafter, therefore, description is made principally on the blade 2 and the reference character "2" used to refer to the term "blade 2" in the following description can be replaced by each of the reference characters "3", "4" and "5" referring to the respective terms "blade 3" to "blade 5".

As shown in FIG. 3 and FIG. 4 in detail, the air-flow resistance adjusting portion 7 includes: an adjuster plate 18 capable of closing the upstream opening of the blade accommodating portion 2A; a servo motor 21 fixed to a side plate 29 of the blade accommodating portion 2A; and a circuit board 22 mounted on a support plate 23 defining a bottom side of the blade accommodating portion 2A.

The adjuster plate 18 is secured to a rotary shaft 25 of the servo motor 21 at a connection portion 26 thereof so as to be oscillated in response to rotary drive by the servo motor 21. The resistance to the flow of cooling air 15 supplied to the blade accommodating portion 2A (cooling air volume) is varied according to the oscillating state (oscillating angle θ of the adjuster plate 18 shown in FIG. 9). Under the rotary drive control of the servo motor 21 by the controller 6 which will be described in detail hereinafter, the adjuster plate 18 is quickly moved in a range between an adjuster plate position 19 (see FIG. 9) to fully open the opening and an adjuster plate position 20 (see FIG. 9) to fully close the opening and fixed to any position in this range.

The servo motor 21 is connected, via a cable 27, to a connector 28 for connecting a servo motor mounted on the circuit board 22 and is adapted to communicate information with the controller 6 or to be supplied with electric power. The information communications between the servo motor 21 and the controller 6, which will be described in detail hereinafter, are performed in order to set or change the oscillating angle θ of the adjuster plate 18 (see FIG. 9).

The upstream fan 13 and the downstream fan 14 produce the cooling air flow by rotating a fan 13B and a fan 14B, respectively, thus cooling the blades 2 to 5 with this cooling air flow. The upstream fan 13 and the downstream fan 14 are connected to the controller 6, which will be described in detail hereinafter, so that fan speeds of the fans 13B and 14B are controlled by the controller 6.

As shown in FIG. 5, the controller 6 is connected to the blades 2 to 5, the upstream fan 13 and the downstream fan 14. The controller 6 receives the temperatures of the cooling air 15 measured by the respective inlet air temperature sensors 12, the power consumption of the respective electronic devices 2B to 5B, the air-flow resistance characteristics of the cooling air 15 supplied to the respective blade accommodating portions 2A to 5A as well as fan speed information from the upstream fan 13 and the downstream fan 14. Further, the controller 6 stores the received information in the storage unit 24 according to a table (see FIG. 6) monitoring the current values of preprogrammed information. It is noted that the current air volume information shown in FIG. 6 is calculated from the above-described air-flow resistance characteristic of each of the blades and fan characteristic obtained from the fan speed information, and is listed in the table. In this manner, the controller 6 assesses cooling air demands or required air volumes for cooling the respective blades 2 to 5 by monitoring the information related to the respective blades 2 to 5.

Subsequently, the controller 6 checks the required air volumes for cooling the respective blades 2 to 5 under the preprogrammed conditions including the power consumption of the respective electronic devices 2B to 5B and the respective inlet air temperatures. The controller 6 checks the required cooling air volumes against a target value table (see FIG. 7) previously stored in the storage unit 24. The target value table defines the required air volumes for cooling the respective blades 2 to 5 in terms of respective power consumption conditions for the electronic devices 2B to 5B and the respective inlet air temperature conditions.

Next, the controller 6 immediately calculates respective air-flow resistance characteristics that provide the minimum cooling air demands of the respective blades 2 to 5. Based on the calculation results, the controller 6 controls the rotation of the servo motor 21 and adjusts the oscillating angle θ of the adjuster plate 18. This oscillating angle θ is acquired from a table (see FIG. 8) which is previously stored in the storage unit 24 and which defines, by mathematization, a relation between the oscillating angle θ and the air-flow resistance characteristic. At the same time, the controller 6 also controls the fan speeds of the upstream fan 13 and the downstream fan 14 in a manner to keep the capacities of the upstream fan 13 and the downstream fan 14 to the minimum necessary.

Figure 10:
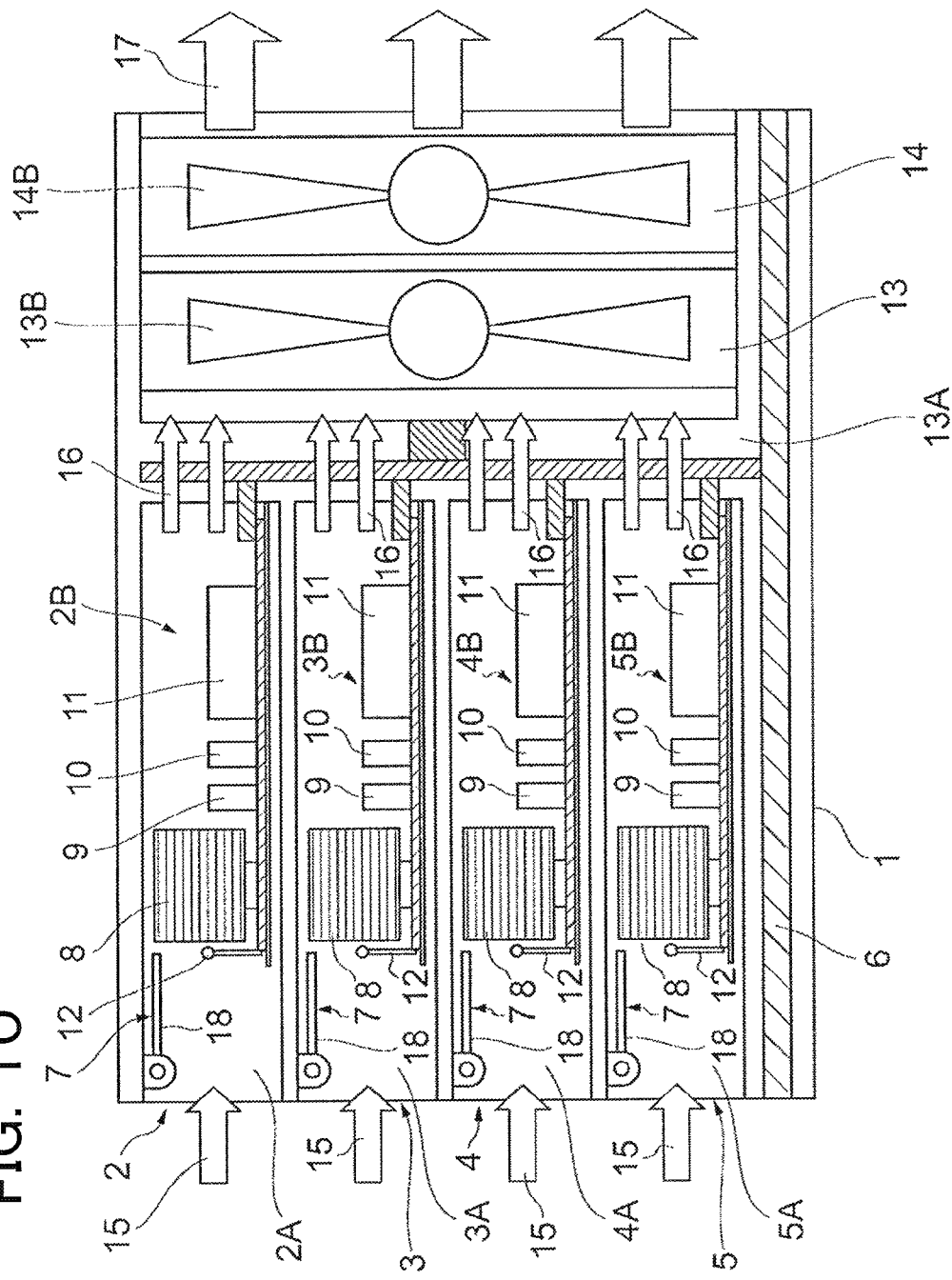
FIG. 10 is a diagram showing an initial state (state prior to control) of the blade server shown in FIG. 2.
Figure 11:
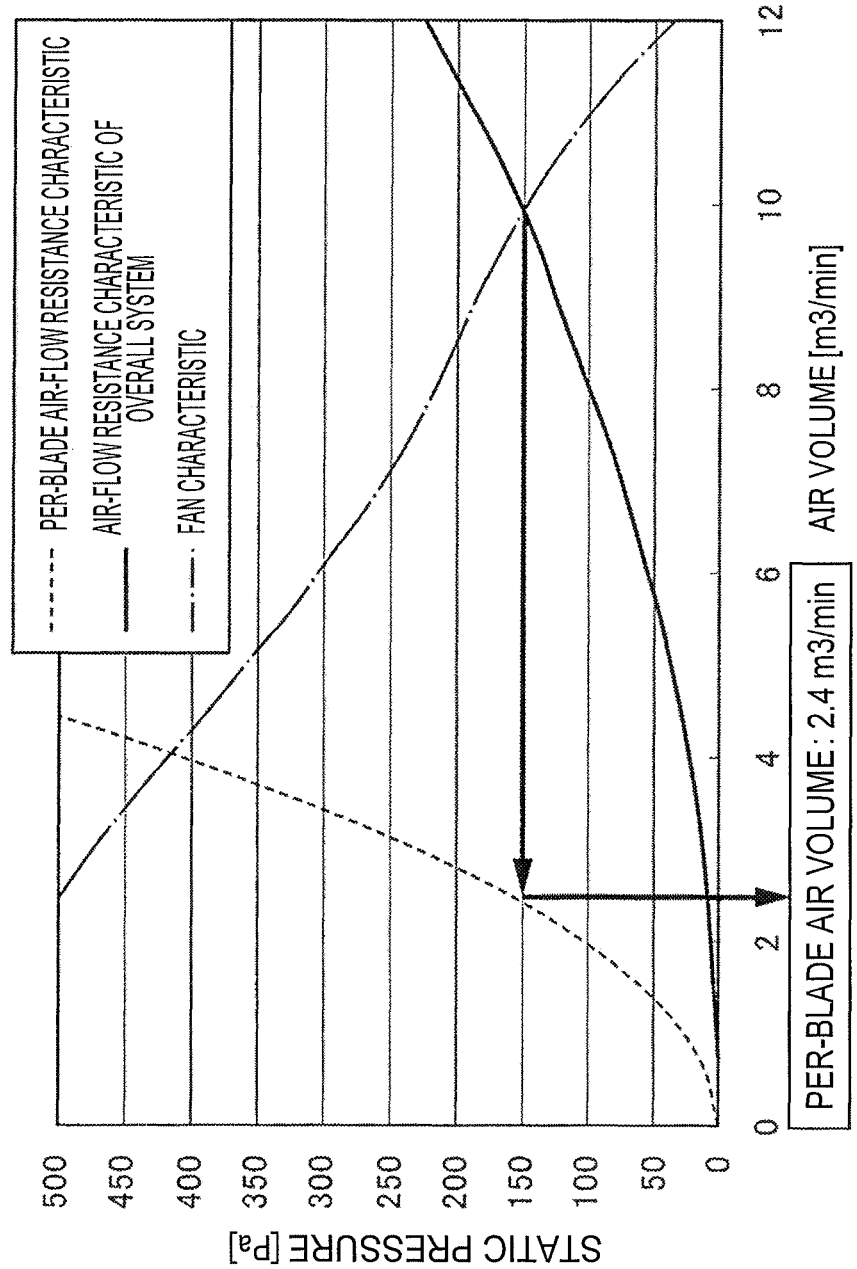
FIG. 11 is a graph showing a relation between the static pressure and the cooling air volume in terms of air-flow resistance characteristic and fan characteristic of the blade server shown in FIG. 2 which is in the initial state (state prior to control)
Figure 12:
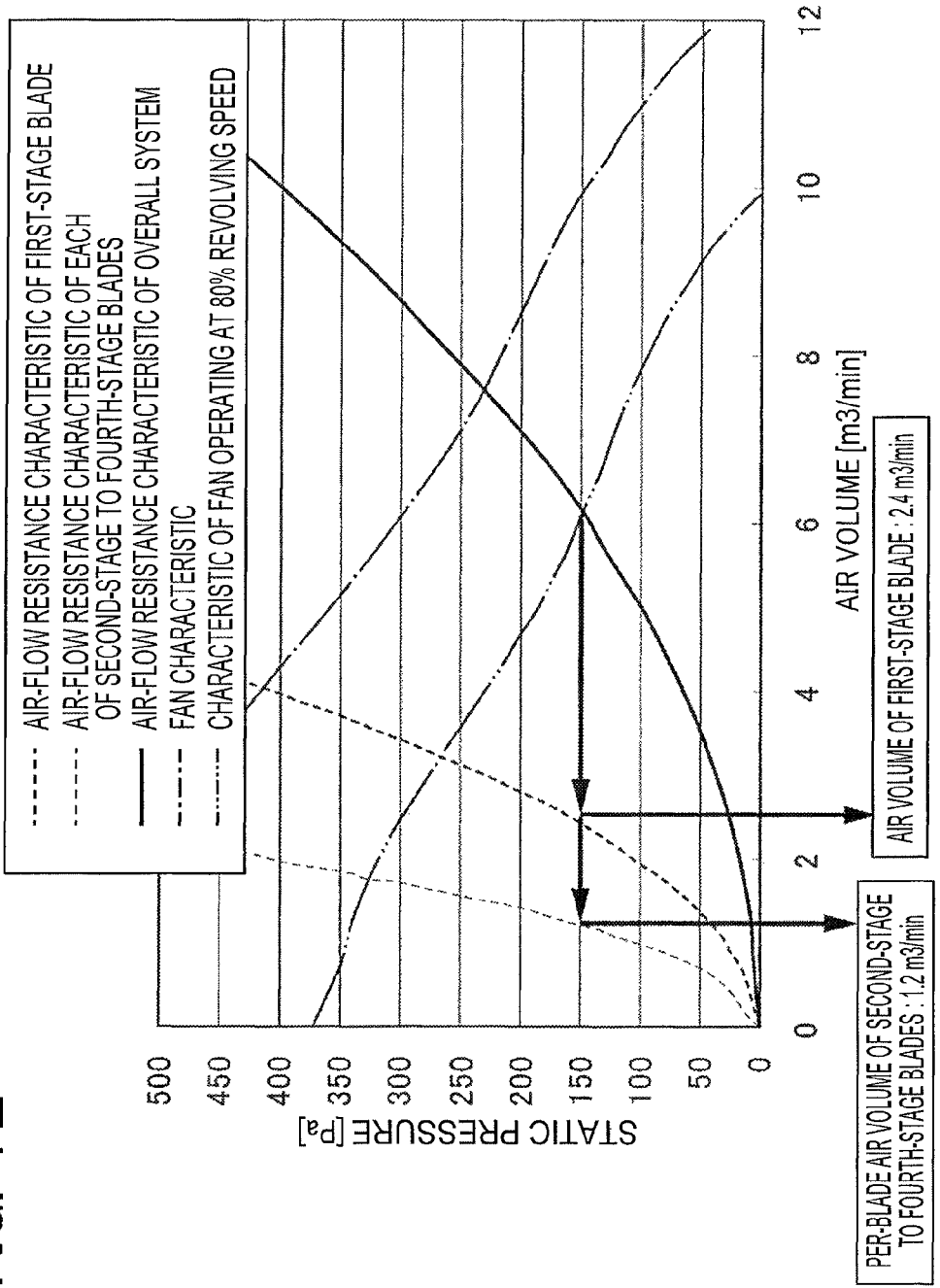
FIG. 12 is a graph showing a relation between the static pressure and the cooling air volume in terms of the air-flow resistance characteristic and the fan characteristic of the blade server shown in FIG. 2 which is subjected to control.

Next, a specific operation of the cooling system of the embodiment is described with reference to the drawings. FIG. 10 is a diagram showing the initial state (state prior to control) of the blade server shown in FIG. 2. FIG. 11 is a graph showing a relation between static pressure and cooling air volume in terms of the air-flow resistance characteristic and the fan characteristic of the blade server shown in FIG. 2 which is in the initial state (state prior to control). FIG. 12 is a graph showing a relation between the static pressure and the cooling air volume in terms of the air-flow resistance characteristic and the fan characteristic of the blade server shown in FIG. 2 which is subjected to control. FIG. 13 is a flow chart showing the steps of an exemplary operation of the cooling system according to the embodiment of the invention.

In the initial state, as shown in FIG. 10, all the adjuster plates 18 stand by at the adjuster plate position to fully open the openings (the position indicated at 19 in FIG. 9). This state is the same as that of a cooling system not including the air-flow resistance adjusting portion 7. All the blades 2 to 5 have the same air-flow resistance characteristic because the internal components (the heat radiating component 8, heat generating components 9 to 11 and the like) of these blades are configured in the same way. This state represents the start of the flow chart shown in FIG. 13.

In Step S101 shown in FIG. 13, the controller 6 drives the fans 13B and 14B of the upstream fan 13 and the downstream fan 14 into rotation. This operation supplies the cooling air 15 to the individual blade accommodating portions 2A to 5A. Then, the inlet air temperature sensors 12 disposed in the respective blades 2 to 5 measure the inlet temperature of the cooling air 15 and send the measurement results to the controller 6. The operation proceeds to Step S102. The current inlet air temperatures thus measured are shown in FIG. 6.

In Step S102, the controller 6 assesses respective heat generating states of the blades 2 to 5. The heat generating state is assessed by acquiring power consumption varying with difference in operating state of the electronic device 2B to 5B, such as calculation performance. The current power consumption of the electronic devices 2B to 5B is shown in FIG. 6. The current power consumption of the first-stage blade 2 is about 1280 W and that of the second-stage blade 3, the third-stage blade 4 and the fourth-stage blade 5 is about 560 W. Then, the operation proceeds to Step S103.

In Step S103, the controller 6 acquires respective air-flow resistance characteristics of the blades 2 to 5. Specifically, the controller 6 assesses the air-flow resistance characteristic of each of the blades 2 to 5 by receiving from the servo motor 21 the information on the oscillating angle θ of the adjuster plate 18 of the air-flow resistance adjusting portion 7. Subsequently, the operation proceeds to Step S104.

In Step S104, the controller 6 acquires fan speed information (fan characteristic) of the fans 13B and 14B of the upstream fan 13 and the downstream fan 14. The current fan speed information is shown in FIG. 6. The current fan speed of the fan 13B of the upstream fan 13 is 3500 rpm while that of the fan 14B of the downstream fan 14 is 4200 rpm. Subsequently, the operation proceeds to Step S105.

In Step S105, the controller 6 calculates the current volume of the cooling air 15 by using a previously defined air-flow resistance characteristic formula of each of the blades 2 to 5 (see FIG. 8), a combined air-flow resistance characteristic formula (formula expressing combined pressure loss) of all the blades 2 to 5 and a fan characteristic formula (per-speed performance characteristic formula of the fan 13B, 14B). In this manner, the controller 6 calculates the air volume to acquire the air volume information on a real-time basis.

FIG. 11 graphically represents the current per-blade air-flow resistance characteristic formula, the current air-flow resistance characteristic formula of the overall system (combined air-flow resistance for all the blades 2 to 5) and the current fan characteristic formula. The cooling air volume in the state shown in FIG. 10 (the initial state) is 2.4 m$^3$/min (see FIG. 11) for every one of the four blades 2 to 5. This value is optimum for the first-stage blade 2 but is excessive for the second-stage to the fourth-stage blades. In the initial state, the air-flow resistance is not adjusted for each of the blades 2 to 5. Namely, the air volumes of the blades 2 to 5 are not adjusted discretely. Hence, the cooling air is supplied in a manner to satisfy the need of the blade 2 requiring the largest amount of cooling air. Namely, the other blades 3 to 5 are supplied with as much cooling air as the blade 2. It is found that the blades 3 to 5 are each supplied with a disproportionate volume of cooling air to the heat generating state thereof (see FIG. 6).

In Step S106, the controller 6 determines respective cooling air volumes required for optimum cooling of the blades 2 to 5 based on the respective inlet air temperatures and power consumption acquired in Steps S101 and S102 and the previously defined target value table (the information shown in FIG. 7). Subsequently, the operation proceeds to Step S107.

In Step S107, the controller 6 adjusts the air-flow resistance to the cooling air 15 supplied to the respective blade accommodating portions 2A to 5A so that every one of the blades 2 to 5 may be supplied with the target volume of the cooling air 15 and that the power consumption of the upstream fan 13 and the downstream fan 14 may be reduced by keeping the fan speeds of the fans 13B and 14B to the minimum necessary.

As to the heat generating states of the blades 2 to 5 as described above, the first-stage blade 2 has a heat value equivalent to 1280 W (power consumption), while the second-stage blade 3, the third-stage blade 4 and the fourth-stage blade 5 each have a heat value roughly equivalent to 560 W (power consumption). The inlet air temperature is about 35° C. Based on these conditions, an assumption can be made that the first-stage blade 2 requires 2.3 m$^3$/min of cooling air and that the second-stage to fourth-stage blades each require about 1 m$^3$/min of cooling air. It is thus understood that the first-stage blade 2 requires the largest volume of air whereas the second-stage to fourth-stage blades each require less than half as much air as the first-stage blade 2. After collecting information related to the above conditions, the controller 6 outputs change commands to the air-flow resistance adjusting mechanism and the fans so that the individual blades may be supplied with the required volume of air, respectively.

Specifically, the controller 6 identifies the blade requiring the largest volume of cooling air (the blade having the highest power consumption: the blade 2 in the embodiment) from the power consumption of the blades 2 to 5 acquired in Step S102. Then, the controller 6 calculates a static pressure by substituting a target air volume (value) in the air-flow resistance characteristic formula that is applied when the adjuster plate 18 of the air-flow resistance adjusting portion 7 in the blade 2 is at the full open position (the position indicated at 19 in FIG. 9: an oscillating angle θ=0°). According to the embodiment, as shown in FIG. 11, the static pressure is 150 Pa.

Next, the controller 6 adjusts the air-flow resistance characteristics of the other blades 3 to 5 in a manner such that the cooling air volumes for the individual blades 2 to 5, as determined by an air-flow characteristic formula at this calculated static pressure (150 Pa), may be at rates of the target air volumes of the blades 2 to 5. In this case, the first-stage blade 2 has the air-flow resistance characteristic to allow the passage of 2.3 m$^3$/min of cooling air 15 at the static pressure of 150 Pa and hence, the air-flow resistance of the second-stage to the fourth-stage blades 3 to 5 is adjusted such that the second-stage to the fourth-stage blades 3 to 5 have the air-flow resistance characteristic to allow the passage of 1 m$^3$/min of cooling air at the static pressure of 150 Pa. Specifically, the controller calculates the oscillating angles θ of the blades 3 to 5 from the target air volumes of the blades 3 to 5 and the previously defined table (the information shown in FIG. 8). The controller 6 performs the drive control of the respective servo motors 21 such that the adjuster plates 18 in the blades 3 to 5 may each form the calculated oscillating angle θ. As a result, as shown in FIG. 2, the adjuster plate 18 of the first-stage blade 2 is at the full open position while the adjuster plates 18 of the second-stage blade 3, the third-stage blade 4 and the fourth-stage blade 5 are each rotated through a predetermined angle (the oscillating angle θ) for increasing the air-flow resistance and fixed to place. The above operation ensures that the individual blades 2 to 5 are provided with optimum volumes of cooling air.

Next, the operation proceeds to Step S108 where the controller 6 performs the drive control of the upstream fan 13 and the downstream fan 14 so as to supply a necessary and sufficient volume of cooling air for adequate cooling of the individual blades 2 to 5 and to reduce the revolving speeds of the fans 13B and 14B. In this embodiment, the controller reduces the fan speeds to the point where there is obtained a fan characteristic to permit the combined air-flow resistance characteristic of all the blades 2 to 5 after the air-flow resistance adjustment to match the static pressure of 150 Pa.

FIG. 12 graphically shows the air-flow resistance characteristic formula of the blade 2, the air-flow resistance characteristic formula of each of the blades 3 to 5 (per-blade air-flow resistance characteristic formula), the air-flow resistance characteristic formula of the overall system (combined air-flow resistance characteristic of all the blades 2 to 5), the fan characteristic formula, and a fan characteristic formula of the fan operating at 80% of the revolving speed in the initial state. It is found from FIG. 12 that in a state where the revolving speed of the fan is reduced to 80% of that before the control of the cooling system is performed (the initial state), the first-stage blade can receive the cooling air volume of 2.4 m$^3$/min while the second-stage to fourth-stage blades 3 to 5 can receive the cooling air volume of 1.2 m$^3$/min.

As described above, the invention ensures that the fans can provide the adequate volume air for satisfying the required air volume (2.4 m$^3$/min) for cooling the first-stage blade 2 and the required air volume (1 m$^3$/min or so) for cooling the second-stage to the fourth-stage blades 3 to 5. Furthermore, as described above, the controller 6 obtains an optimum solution by calculation when making adjustment of the air-flow resistance characteristics of the individual blades 2 to 5 or changing the revolving speeds of the fans. The controller 6 can immediately calculate the optimum solution and change the fan speed accordingly. In this way the cooling system is provided that is adapted to achieve real-time control for reducing the power consumption and the noises of the fans.

On the other hand, in a blade server employing a cooling system not including the air-flow resistance adjusting portion according to the invention, all the blades have the same air-flow resistance characteristic and hence, the adjustment of the air volume cannot be made on a per-blade basis. Accordingly, the individual blades are always supplied with as much volume of cooling air as required by the blade generating the largest amount of heat. Depending upon the heat generating state, therefore, some blades receive an excessive volume of cooling air. This makes it impossible for the system to achieve the reduction of power consumption and noises.

What is claimed is:

1. A cooling system for an electronic device comprising:
   a frame;
   a plurality of electronic devices disposed in the frame and operating or functioning independently from each other;
   a fan disposed in the frame and supplying cooling air to the plurality of electronic devices for cooling the plurality of electronic devices;
   a temperature acquiring portion disposed in the frame and acquiring temperature information of the cooling air supplied to each of the electronic devices;
   an air-flow resistance adjusting portion disposed in the frame and adjusting the resistance to a flow of the cooling air supplied to the each electronic device; and
   a controller for controlling the fan and the each air-flow resistance adjusting portion,
   wherein the controller determines each target cooling air volume required for cooling the each electronic device to a predetermined temperature based on temperature information acquired by the temperature acquiring portion and heat generation information on the each electronic device, controls the each air-flow resistance adjusting portion to set the volume of cooling air supplied by the fan to the each target cooling air volume, and performs the drive control of the fan to set the volume of cooling air supplied by the fan to the minimum necessary.

2. The cooling system for electronic device according to claim 1, further comprising a storage unit for storing a control table showing a relation among the temperature of the cooling air supplied to the electronic device, the power consumption of the electronic device, and the target cooling air volume required for cooling the electronic device to the predetermined temperature,
   wherein the controller acquires the power consumption of the each electronic device as the heat generation information and determines the target cooling air volume based on the temperature information, the power consumption and the control table.

3. The cooling system for electronic device according to claim 2, further comprising a storage unit for storing a control table showing a relation between the revolving speed of the fan and the fan performance characteristic according to the revolving speed of the fan,
   wherein the controller controls the revolving speed of the fan based on the each target cooling air volume and the control table.

4. The cooling system for electronic device according to claim 1,
   wherein the frame includes electronic device accommodating portions discretely accommodating the electronic devices,
   wherein the air-flow resistance adjusting portion includes an adjuster plate which is oscillatably disposed in the each electronic device accommodating portion and varies the area of a flow passage of the cooling air in conjunction with the oscillating movement thereof, and
   wherein the controller controls the air-flow resistance to the cooling air supplied to the each electronic device accommodating portion by varying the oscillating angle of the adjuster plate based on the target cooling air volume.

5. The cooling system for electronic device according to claim 1, comprising a plurality of the fans which are arranged in series on a flow passage of the cooling air.

6. An electronic apparatus comprising the cooling system for an electronic device according to claims 1.

* * * * *